United States Patent
Chen et al.

(10) Patent No.: US 10,276,561 B2
(45) Date of Patent: *Apr. 30, 2019

(54) SEMICONDUCTOR STRUCTURE WITH RESISTOR LAYER AND METHOD FOR FORMING THE SAME

(71) Applicant: Taiwan Semiconductor Manufacturing Co., Ltd., Hsinchu (TW)

(72) Inventors: I-Tseng Chen, Taipei (TW); Hon-Lin Huang, Hsinchu (TW); Chun-Hsien Huang, Hsinchu (TW); Yu-Hung Lin, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/714,226

(22) Filed: Sep. 25, 2017

(65) Prior Publication Data

US 2018/0026031 A1    Jan. 25, 2018

Related U.S. Application Data

(63) Continuation of application No. 14/856,813, filed on Sep. 17, 2015, now Pat. No. 9,773,779.

(Continued)

(51) Int. Cl.
*H01L 27/06* (2006.01)
*H01L 21/8234* (2006.01)

(Continued)

(52) U.S. Cl.
CPC .... *H01L 27/0629* (2013.01); *H01L 21/02271* (2013.01); *H01L 21/823437* (2013.01); *H01L 28/20* (2013.01)

(58) Field of Classification Search
CPC .............. H01L 27/11; H01L 27/10897; H01L 27/0629; H01L 28/20; H01L 21/823437; H01L 21/02271

See application file for complete search history.

(56) References Cited

U.S. PATENT DOCUMENTS

| 5,733,669 A | 3/1998 | Veyhl et al. |
| 6,171,922 B1 | 1/2001 | Maghsoudnia et al. |

(Continued)

FOREIGN PATENT DOCUMENTS

| TW | 200845013 | 11/2008 |
| TW | 201203536 | 1/2012 |

OTHER PUBLICATIONS

Inganson et al., "In-situ electrical characterization of ultrathin TiN firlm grown by reactive de magnetron sputtering on SiO2," This Solid Films 517 (2209), pp. 6731-3736.

(Continued)

*Primary Examiner* — Julia Slutsker
(74) *Attorney, Agent, or Firm* — Haynes and Boone, LLP

(57) ABSTRACT

A method for forming a semiconductor device structure is provided. The method includes providing a substrate. The method includes transferring the substrate from a stage to a deposition chamber, and no heating operation is performed on the stage. The method also includes depositing a resistor layer on the substrate. The resistor layer may have a major structure that is amorphous.

20 Claims, 8 Drawing Sheets

Related U.S. Application Data

(60) Provisional application No. 62/201,943, filed on Aug. 6, 2015.

(51) Int. Cl.
*H01L 21/02* (2006.01)
*H01L 49/02* (2006.01)

(56) References Cited

U.S. PATENT DOCUMENTS

| | | |
|---|---|---|
| 6,331,811 B2 | 12/2001 | Shibuya et al. |
| 7,253,109 B2 | 8/2007 | Ding et al. |
| 7,271,700 B2 | 9/2007 | Chinthakindi et al. |
| 8,680,618 B2 | 3/2014 | Eshun et al. |
| 8,735,258 B2 | 5/2014 | Ko et al. |
| 8,859,386 B2 | 10/2014 | Lu et al. |
| 9,773,779 B2 * | 9/2017 | Chen .................. H01L 27/0629 |
| 2008/0273364 A1 | 11/2008 | Chao |
| 2012/0001141 A1 | 1/2012 | Hsieh et al. |

OTHER PUBLICATIONS

Cheng et al., "Stability and Reliability of Ti/TiN as a Thin Film Resistor," ECS Journal of Solid State Science and Technology, 2 (2013), pp. Q12-Q15.

* cited by examiner

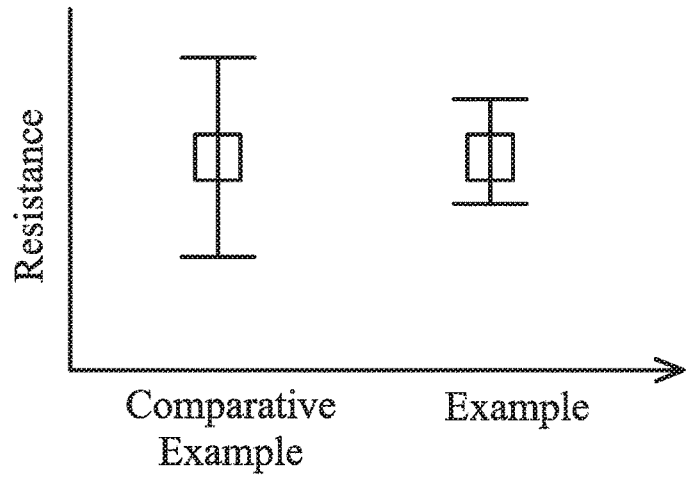

FIG. 3

```
┌─────────────────────────────────────────┐
│ providing a substrate, the substrate    │
│ comprises a gate structure over the     │──402
│ substrate and an inter-layer dielectric │
│ (ILD) layer adjacent to the gate        │
│ structure                               │
└─────────────────────────────────────────┘
                    │
                    ▼
┌─────────────────────────────────────────┐
│ transferring the substrate from a stage │──404
│ to a deposition chamber                 │
└─────────────────────────────────────────┘
                    │
                    ▼
┌─────────────────────────────────────────┐
│ performing a deposition process over    │
│ the ILD layer in the deposition chamber │──406
│ to form a resistor layer over the ILD   │
│ layer                                   │
└─────────────────────────────────────────┘
```

SEMICONDUCTOR STRUCTURE WITH RESISTOR LAYER AND METHOD FOR FORMING THE SAME

CROSS REFERENCE TO RELATED APPLICATIONS

This application is a continuation application of U.S. application Ser. No. 14/856,813 filed Sep. 17, 2015, issuing as U.S. Pat. No. 9,773,779, which also claims the benefit of U.S. Provisional Application No. 62/201,943 filed on Aug. 6, 2015, and entitled "Semiconductor structure with resistor layer and method for forming the same", the entirety of each is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip chambers, for example, or in other types of packaging.

The size of semiconductor devices has continuously been reduced in the fabrication process in order to increase device density. Accordingly, a multi-layered interconnect structure is provided. The interconnect structure may include a resistor layer.

Although existing resistor layers and methods of fabricating resistor layers have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3 shows a box plot of the resistance data for a Comparative Example and an Example, in accordance with some embodiments of the disclosure.

FIG. 4 shows a flow chart of a method for forming a semiconductor device structure, in accordance with some embodiments of the disclosure.

DETAILED DESCRIPTION

Figure 1A:
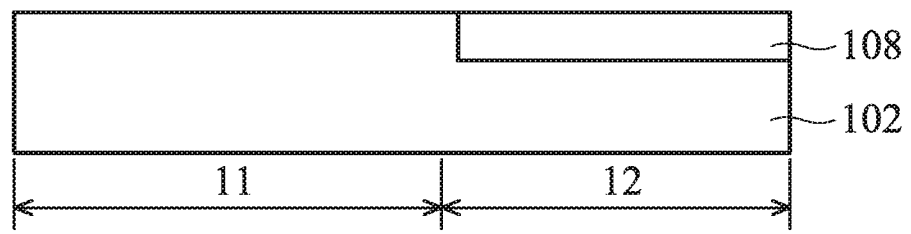
FIGS. 1A-1J show cross-sectional representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a semiconductor device structure and method for forming the same are provided. FIGS. 1A-1I show cross-sectional representations of various stages of forming a semiconductor device structure, in accordance with some embodiments of the disclosure.

Referring to FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

The substrate 102 includes a first region 11 and a second region 12. In some embodiments, the first region 11 is an active region 11 and the second region 12 is a second region 12. Some device elements (such as transistors) are formed in the first region 11. A resistor will be formed in the second region 12.

In some embodiments, the transistors include metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs). Various processes are performed to form the transistors, such as deposition, etching, implantation, photolithography, annealing, and/or other applicable processes.

An isolation structure 108 is formed in the substrate 102 in the second region 12. The isolation structure 108 may be shallow trench isolation (STI) features or local oxidation of silicon (LOCOS) features. The isolation structure 108 is used to define and isolate various device elements.

Figure 1B:
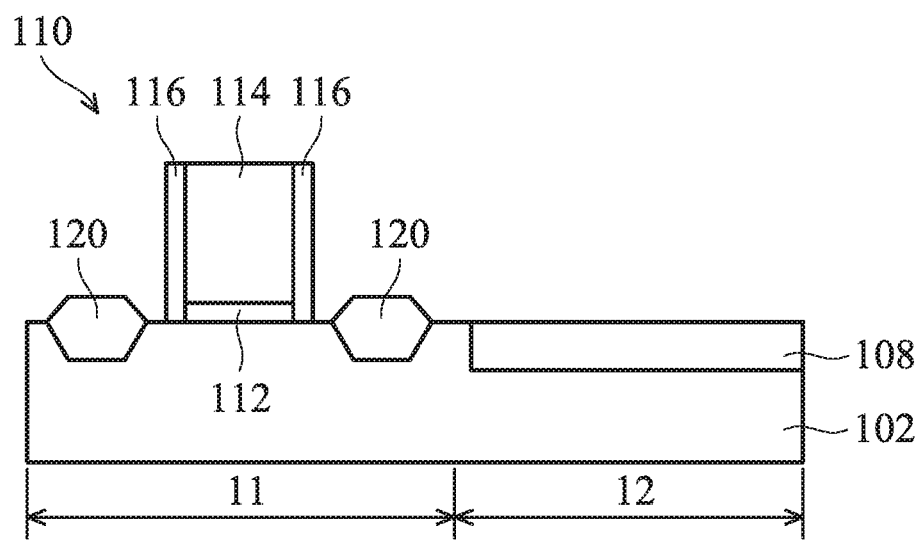

After the isolation structure 108 is formed in the substrate 102, a dummy gate structure 110 is formed over the substrate 102 in the first region 11 as shown in as shown in FIG. 1B, in accordance with some embodiments of the disclosure. In some embodiments, the gate structure 110 is formed over the substrate 102 in a front-end-of-line (FEOL) process.

The dummy gate structure 110 includes a dummy gate dielectric layer 112 and a dummy gate electrode 114. In some embodiments, the dummy gate dielectric layer 112 is made of silicon oxide, and the dummy gate electrode 114 is made of polysilicon layer. The dummy gate dielectric layer 112 and the dummy gate electrode 114 will be replaced by a high-k dielectric layer and a metal gate electrode layer, respectively, by the following processes.

The spacers 116 are formed on the opposite sidewalls of the dummy gate structure 110. The spacers 116 may be a single layer or multiple layers. In some embodiments, the spacers 116 are made of silicon nitride, silicon carbide, silicon oxynitride, silicon carbon, silicon oxide, silicon hydrogen, other applicable materials or combinations thereof.

In addition, the substrate 102 may include various doped regions such as p-type wells or n-type wells). The doped regions may be doped with p-type dopants, such as boron or $BF_2$, and/or n-type dopants, such as phosphorus (P) or arsenic (As). The doped regions may be formed directly on the substrate 102, in a P-well structure, in an N-well structure, or in a dual-well structure.

As shown in FIG. 1B, a source/drain (S/D) structure 120 is formed in the substrate 102. In some embodiments, portions of the substrate 102 adjacent to the dummy gate structure 110 is recessed to form recesses at two sides of the dummy gate structure 110, and a strained material is grown in the recesses by an epitaxial (epi) process to form the source/drain (S/D) structure 120. In addition, the lattice constant of the strained material may be different from the lattice constant of the substrate 102. In some embodiments, the source/drain (S/D) structure 120 includes germanium (Ge), silicon germanium (SiGe), indium arsenide (InAs), indium germanium arsenide (InGaAs), indium antimonide (InSb), germanium arsenide (GaAs), germanium antimonide (GaSb), indium aluminum phosphide (InAlP), indium phosphide (InP), or the like.

The epitaxial process may include a selective epitaxy growth (SEG) process, CVD deposition techniques (e.g., vapor-phase epitaxy (VPE) and/or ultra-high vacuum CVD (UHV-CVD)), molecular beam epitaxy, or other suitable epi processes.

Figure 1C:
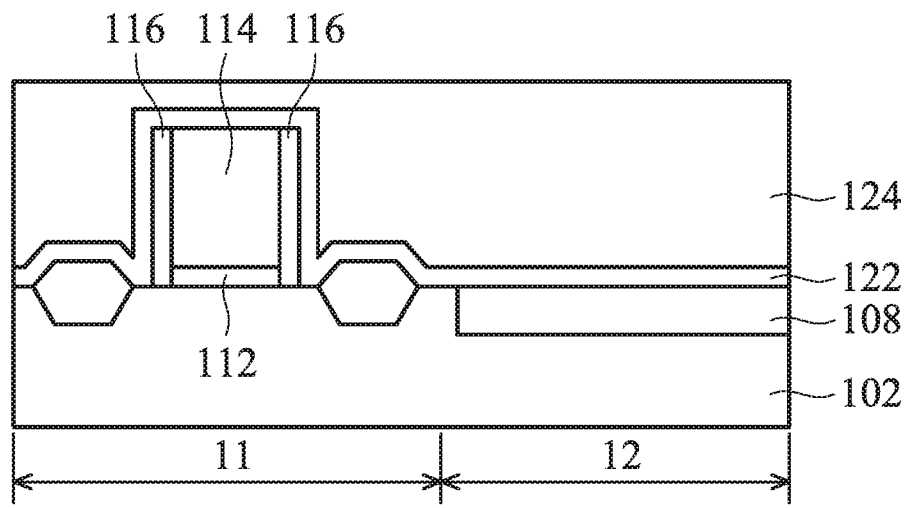

Afterwards, after the source/drain structures 120 are formed, a contact etch stop layer (CESL) 122 is formed on the source/drain structures 120 and the dummy gate structure 110 as shown in FIG. 1C, in accordance with some embodiments of the disclosure.

In some embodiments, the contact etch stop layer (CESL) 122 is made of silicon nitride, silicon oxynitride, other applicable materials, or combinations thereof. The contact etch stop layer (CESL) 122 may be formed by plasma enhanced chemical vapor deposition (CVD), low pressure CVD, atomic layer deposition (ALD), or other applicable processes.

Afterwards, the inter-layer dielectric (ILD) layer 124 is formed over the contact etch stop layer 122 over the substrate 102. Afterwards, the ILD layer 124 is planarized to expose the dummy gate electrode layer 114.

Figure 1D:
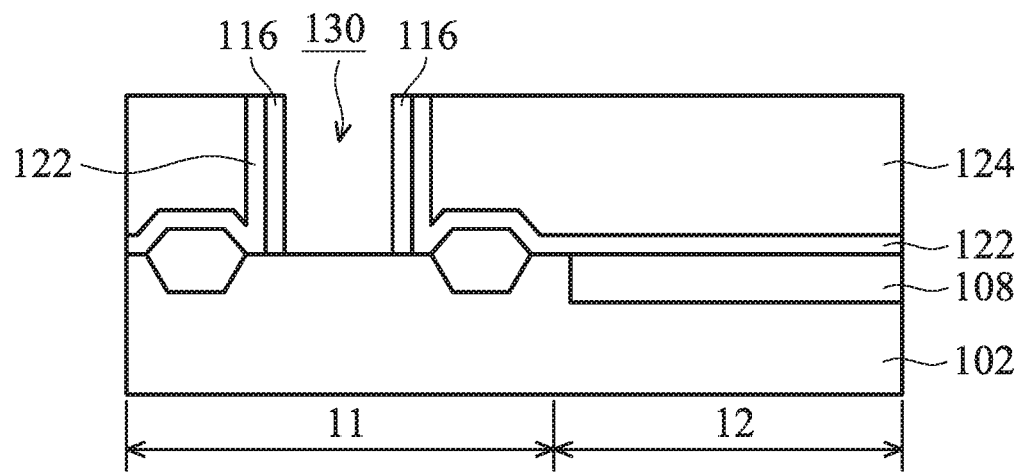

Afterwards, the dummy gate structure 110 is removed to form a trench 130 in the ILD layer 124 as shown in FIG. 1D, in accordance with some embodiments. The dummy gate dielectric layer 112 and the dummy gate electrode 114 may be removed by multi-etching processes.

Figure 1E:
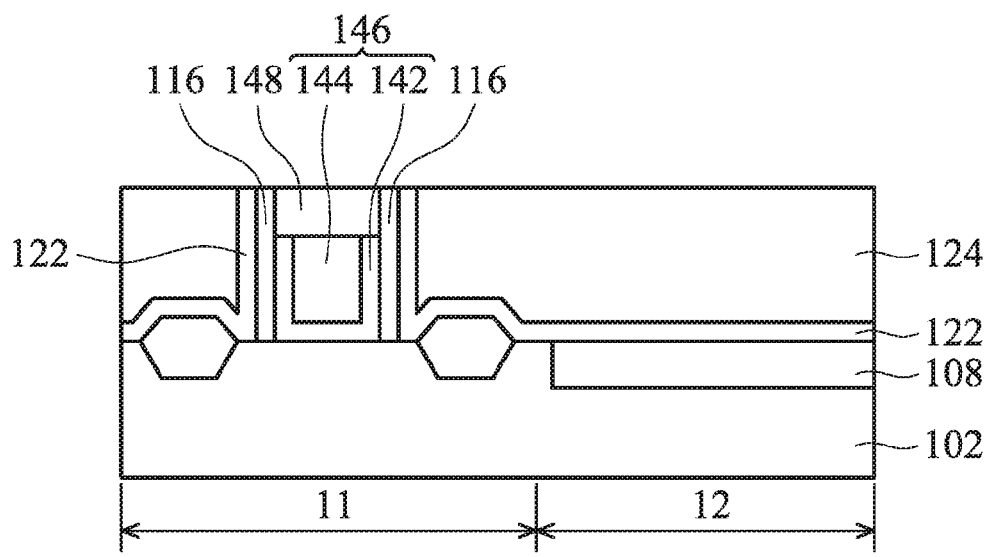

Afterwards, a gate dielectric layer 142 and a gate electrode 144 are sequentially formed in the trench 130 as shown in FIG. 1E, in accordance with some embodiments. Therefore, a gate structure 146 including the gate dielectric layer 142 and the gate electrode layer 144 is obtained.

In some embodiments, the gate dielectric layer 142 is made of a high-k dielectric material. The high-k dielectric material may include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or the like.

In some embodiments, the gate electrode layer 144 is made of a metal material. The metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or combinations thereof. The P-work-function metal includes titanium nitride (TiN), tungsten nitride (WN), tantalum nitride (TaN), ruthenium (Ru) or combinations thereof.

A hard mask layer 148 is formed over the gate electrode layer 144. In some embodiments, the hard mask layer 148 is made of silicon nitride. The hard mask layer 148 may be formed by using low-pressure chemical vapor deposition (LPCVD) or plasma enhanced chemical vapor deposition (PECVD), although other deposition processes may also be used in some other embodiments.

Figure 1F:
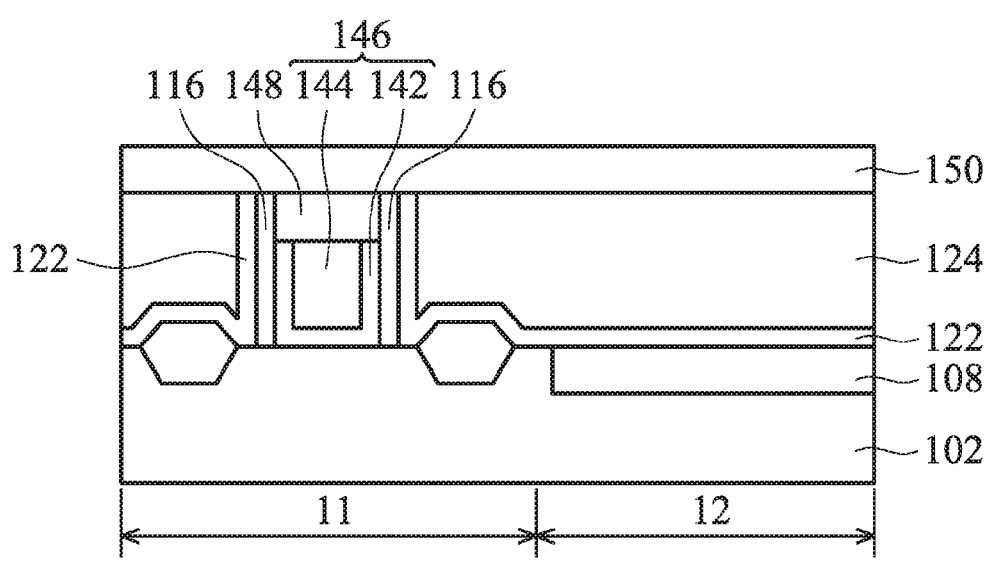

Afterwards, an insulting layer 150 is formed over the ILD layer 124 and the hard mask layer 148 as shown in FIG. 1F, in accordance with some embodiments. In some embodiments, the insulating layer 150 is made of silicon oxide. In some embodiments, the insulating layer 150 is formed by a chemical vapor deposition (CVD) process, a physical vapor deposition (PVD) process or another applicable process.

Figure 1G:
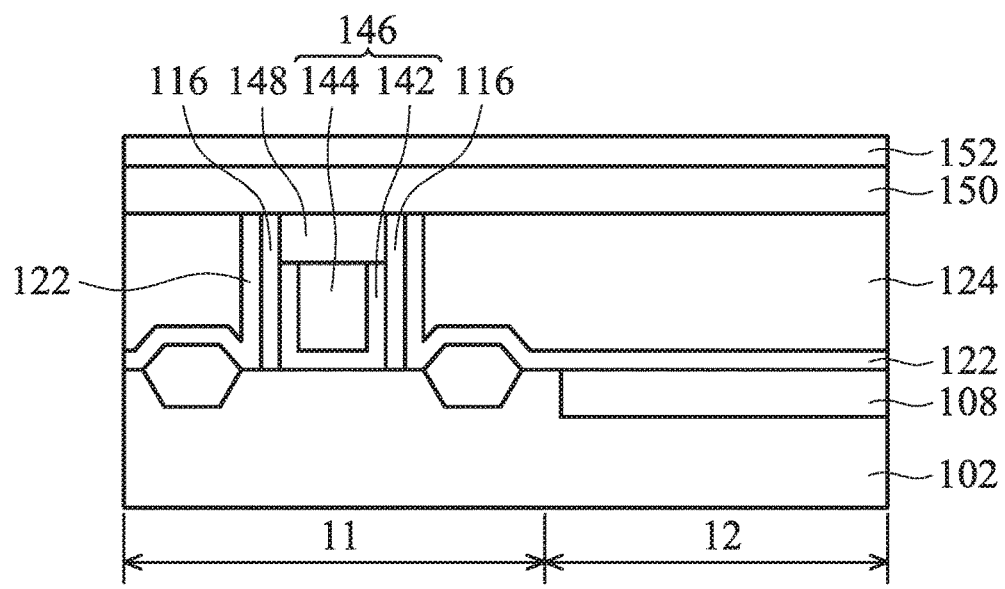

Afterwards, a resistor layer 152 is formed over the insulating layer 150 as shown in FIG. 1G, in accordance with some embodiments.

The resistor layer 152 is used as a high resistor device which may be used to modulate a voltage of the gate structure or the current passing through the gate structure. The resistor layer 152 is made of titanium nitride (TiN), tantalum nitride (TaN), silicon chrome (SiCr), aluminum nitride (AlN) or combinations thereof. It should be noted that the major structure of the resistor layer 152 is amorphous.

In some embodiments, the resistor layer 152 is formed by a deposition process, such as a chemical vapor deposition (CVD) process, a physical vapor deposition (PVD) process.

The resistor layer 152 is formed along (111), (200) and (220) crystal orientations, and an intensity of (200) crystal orientation is higher than an intensity of the (111) crystal orientation. In addition, an intensity of (220) crystal orientation is substantially equal to the intensity of (111) crystal orientation.

In some embodiments, the resistor layer 152 has a thickness in a range from about 40 Å to about 50 Å. If the thickness of the resistor layer 152 is smaller than 40 Å, the resistance may be too high. If the thickness of the resistor layer 152 is greater than 50 Å, the resistance may be too low.

If some grain boundaries formed in the resistor layer 152, some atoms may migrate along the grain boundary, and the resistance of the resistor layer 152 may become unstable. In some embodiments, the resistor layer 152 substantially has no grain boundary. In other words, the resistance of the resistor layer 152 will not be affected by elements which may diffuse from other layers. Therefore, the uniformity of the resistance of the resistor layer 152 is improved.

Figure 1H:
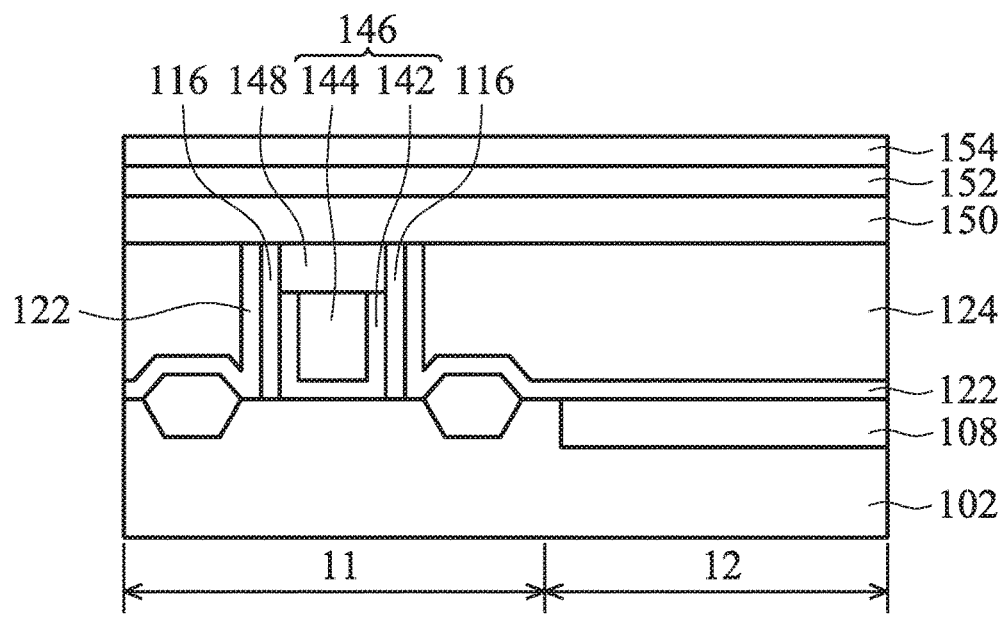

After the resistor layer 152 is formed, a nitride layer 154 is formed over the resistor layer 152 as shown in as shown in FIG. 1H, in accordance with some embodiments. In some embodiments, the nitride layer is made of silicon nitride (SiN).

In some embodiments, before forming the nitride layer 154, a heating operation is performed on the resistor layer 152. The heating operation is configured to remove the moisture. Afterward, a plasma process is performed on the resistor layer 152 to form the nitride layer 154. The plasma process includes using nitrogen-containing plasma, such as nitrogen ($N_2$) process.

Figure 1I:
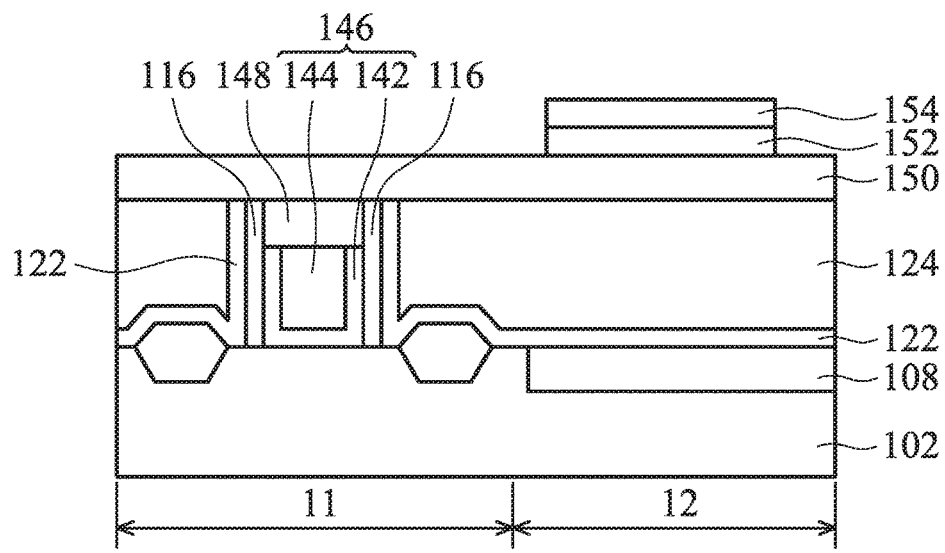

Afterwards, a pattering process is performed to form the resistor layer 152 over the second region 12 as shown in FIG. 1I, in accordance with some embodiments. The patterning process includes a photolithography process and an etching process. Photolithography process includes soft baking, mask aligning, exposure, post-exposure baking, developing the photoresist, rinsing and drying (e.g., hard baking). The etching process includes dry etching or wet etching process.

Figure 1J:
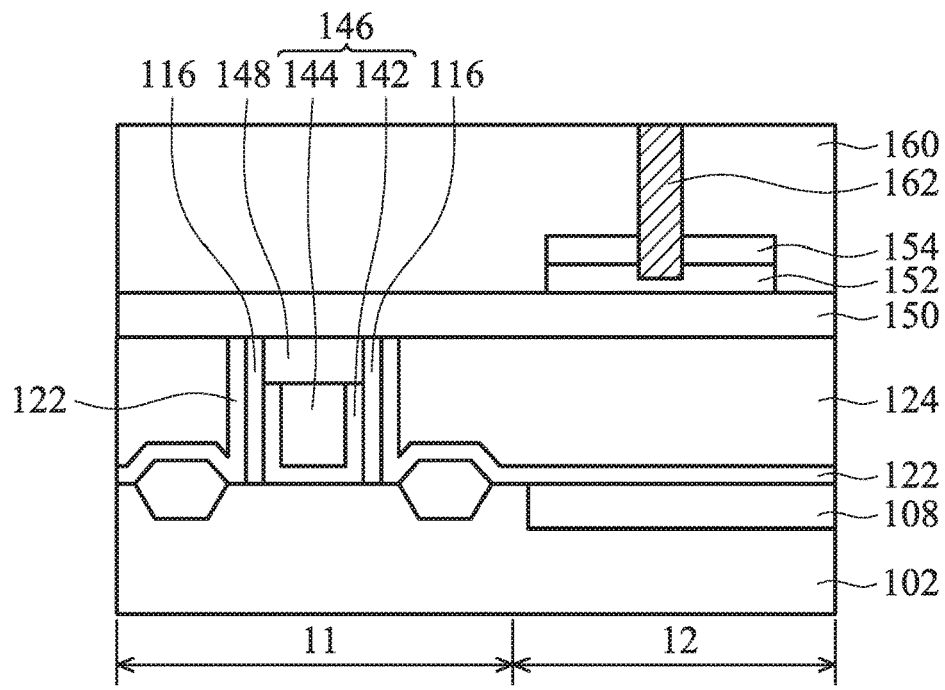

Afterwards, a dielectric layer 160 is formed over the nitride layer 154 in the second region 12 and the insulating layer 150 in the first region 11 as shown in FIG. 1J, in accordance with some embodiments.

In some embodiments, the dielectric layer 160 is an inter-layer metal (IMD) layer. The dielectric layer 160 may be a single layer or multiple layers. The dielectric layer 160 is made of silicon oxide (SiOx), silicon nitride (SixNy), silicon oxynitride (SiON), dielectric material(s) with low dielectric constant (low-k), or combinations thereof.

In some embodiments, the dielectric layer 160 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the dielectric layer 160 is deposited by a chemical vapor deposition process (such as plasma enhanced chemical vapor deposition, PECVD) process or by a spin coating process.

Afterwards, a trench (not shown) is formed through the dielectric layer 160, the nitride layer 154 and a portion of the resistor layer 152, and a conductive material is filled into the trench. As a result, a conductive via 162 is formed. The trench is formed by a patterning process.

The conductive via 162 is a portion of an interconnect structure. The interconnect structure is used to electrically connect the signal of the device elements which are formed in the first region 11 to outer device (not shown).

The conductive via 162 shown is merely for illustrative purposes. The conductive via 162 may include other configurations and may include one or more conductive lines and via layers.

The conductive via 162 may include a diffusion barrier layer (not shown) and a conductive material. The diffusion barrier layer is used to prevent diffusion of the conductive material into the adjacent areas. The dielectric layer 160 and the conductive via 162 are formed in a back-end-of-line (BEOL) process.

In some embodiments, the conductive via 162 is made of metal, such as copper (Cu), copper alloy, aluminum (Al), aluminum alloy, tungsten (W), tungsten alloy, titanium (Ti), titanium alloy, tantalum (Ta) or tantalum alloy, cobalt (Co). In some embodiments, when the conductive via 162 is made of copper (Cu) or copper based alloy, the conductive via 162 has improved resistance values for propagating signals through the copper (Cu) interconnect at high speed.

Figure 2A:
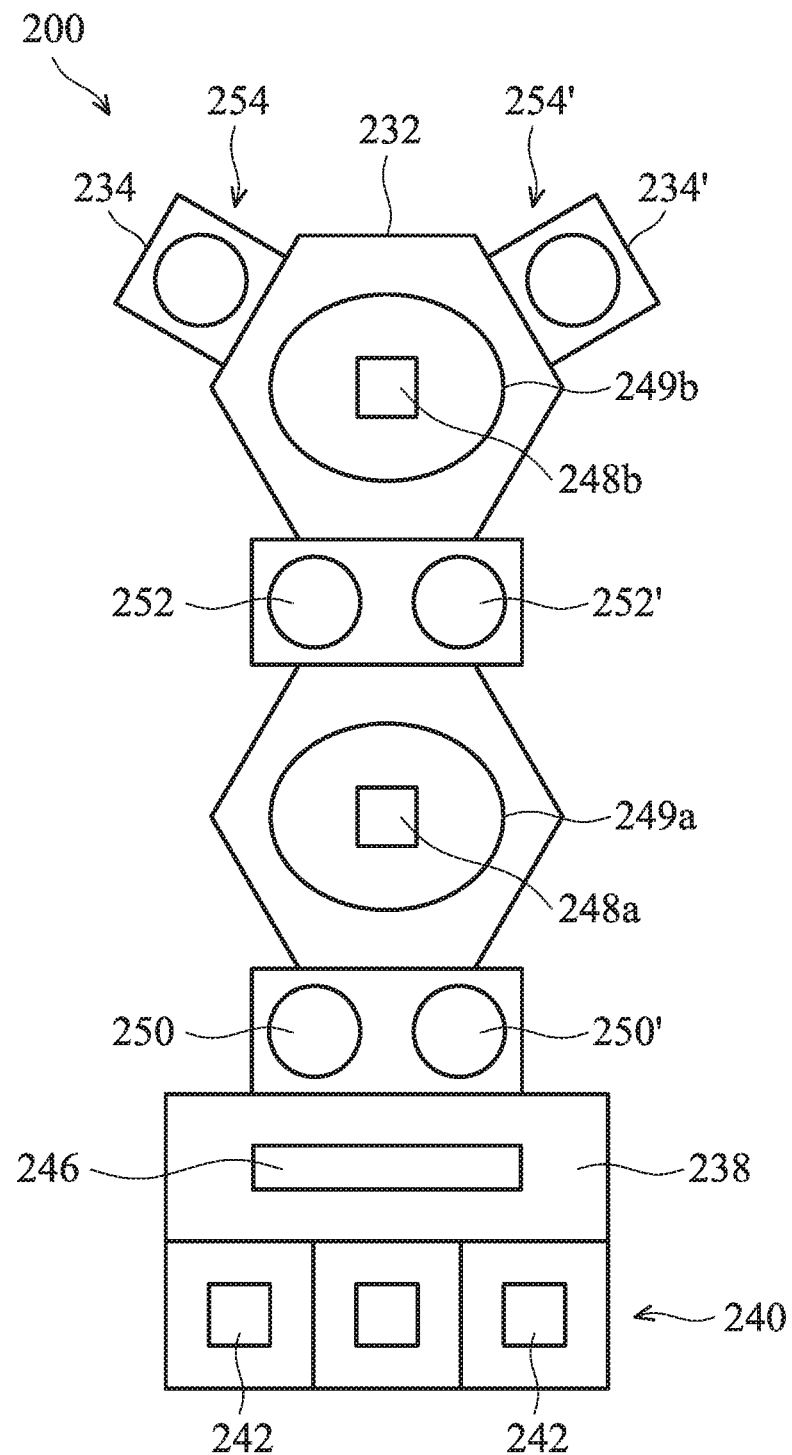
FIG. 2A shows a block diagram of a process chamber for forming a semiconductor device structure, in accordance with some embodiments of the disclosure.

FIG. 2A shows a block diagram of a process chamber 200 for forming a semiconductor device structure, in accordance with some embodiments of the disclosure. In some embodiments, the substrate 102 is a portion of a wafer, and the wafer is placed in the process chamber 200 for forming the resistor layer 152 over the substrate 102.

The process chamber 200 includes a mainframe 232 and a plurality of chambers 234, 234' which are disposed adjacent to the mainframe 232. The chambers 234 and 234' are adapted to perform predetermined functions on the substrate 102. The process chamber 200 includes two paths 254, 254'. The paths 254, 254' include the same types of chambers 234 and 234', respectively, and therefore two or more substrate 102 may be processed simultaneously.

The chamber 234 is configured to perform a physical vapor deposition (PVD) process, an atomic layer deposition (ALD) process, a CVD process, another processes, and/or combinations thereof. In some embodiments, the chamber 234 is a PVD chamber to perform a PVD process.

The mainframe 232 includes first stages 250, 250' and second stages 252 and 252'. In some embodiments, the first stages 250, 250' include a vacuum stage.

The process chamber 200 also includes a transport area 238 and a load port 240. The transport area 238 is formed between the load port 240 and the first stages 250, 250', and the first stages 250, 250' are formed between the transport area 238 and the second stage 252 and 252'.

The load port 240 includes one or more supports 242 for supporting the substrate 102. The transport area 238 includes a robotic device 246. The robotic device 246 is configured to move a wafer (not shown) including the substrate 102 from one of the supports 242 into the mainframe 232. The robotic device 246 is also configured to move the wafer into the first stage 150 of the mainframe 232. The robotic device 246 is also referred to herein as a first robotics device 246.

The process chamber 200 further includes a robotic device 248a and 248b disposed inside the mainframe 232. In some embodiments, the robotics device 248a and 248b are disposed within a transfer chamber 249a and 249b, respectively. The robotic devices 248a and 248b are also referred to herein as a second robotic device. The robotic devices 248a and 248b are configured to move the wafer from one of chambers 234 and 234' and stages 250, 250', 252, and 252' to another one of the chambers 234 and 234' and stages 250, 250', 252, and 252'.

The second stages 252 and 252' may include holding stages where robotic device 248a places a wafer until robotic device 248b picks up the wafer, and vice versa. The robotics device 248a and 248b are located in a substantially central region of the mainframe 132. Other stages and chambers may also be included in the process chamber 200, not shown.

Figure 2B:
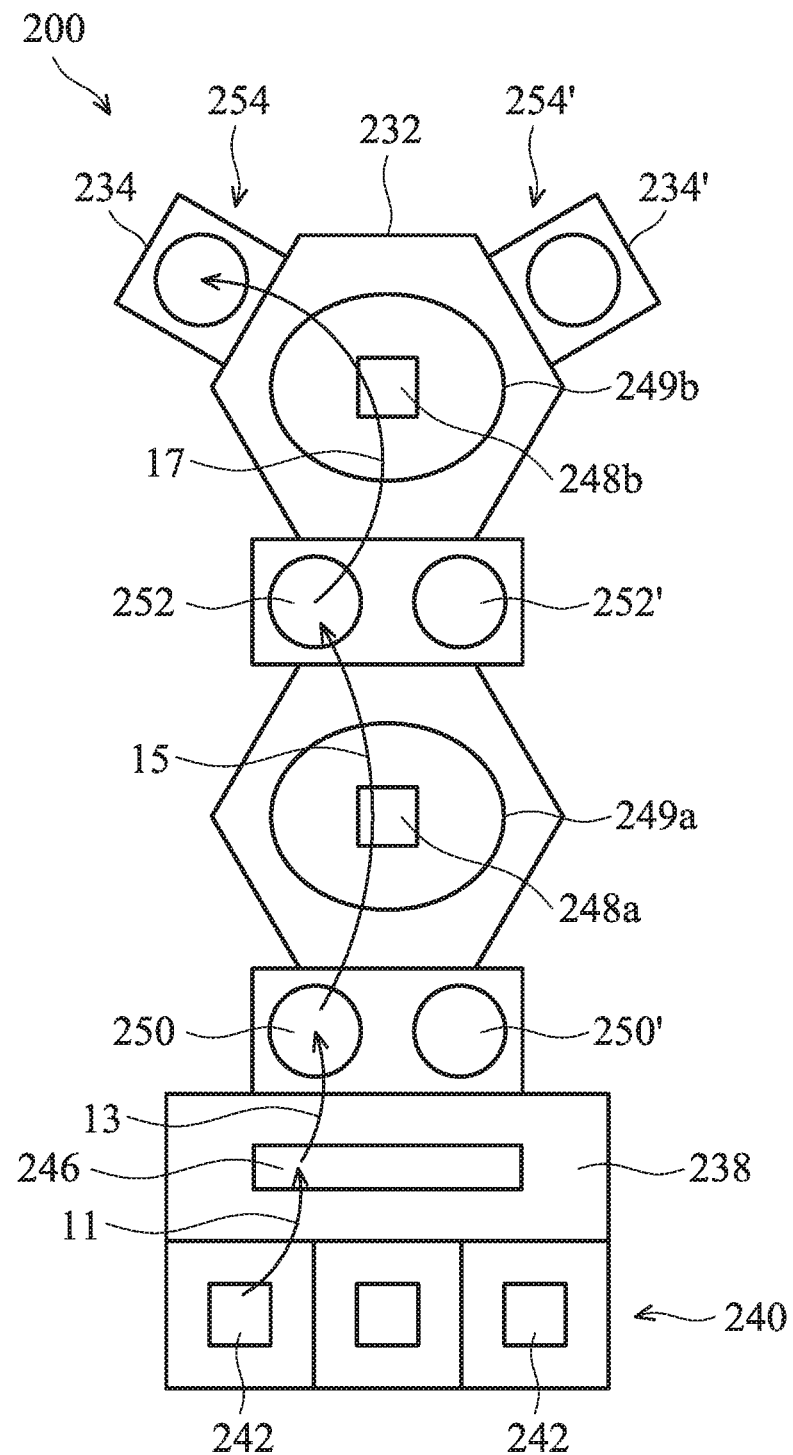
FIG. 2B shows a path for transferring a wafer including the substrate in the process chamber, in accordance with some embodiments of the disclosure.

FIG. 2B shows a path for transferring a wafer including the substrate 102 in the process chamber 200, in accordance with some embodiments of the disclosure.

A wafer including the substrate 102 is firstly placed in the supports 242, and then is transferred into the transport area 238 by the robotic device 246 along the arrow 11. Then, the wafer is transferred into the first stage 250 by the robotic device 246 along the arrow 13. Next, the wafer is transferred from the first stage 250 to the second stage 252 by the robotic device 248a along the arrow 15. Then, the wafer is transferred from the second stage 252 to the chamber 234 by the robotic device 248b along the arrow 17. It should be noted that the wafer including the substrate 102 is not heated by a heating operation before entering into the chamber 234. In other words, the substrate 102 is maintained at a constant temperature before performing the deposition process. The substrate 102 is not heated before forming the resistor layer 152 over the ILD layer 124. In some embodiments, the substrate 102 is maintained at room temperature, such as 20 degrees to 40 degrees.

The operations for forming the resistor layer 152 are described as follows. The substrate 102 is firstly moved from the load port 240 to the transport area 238. Next, the substrate 102 is transported from the transport area 238, through the first stage 250, the second stage 252 into the chamber 234. A deposition process is performed in the chamber 234. In some embodiments, a temperature of the substrate 102 is lower than a temperature of the chamber 234. In some embodiments, the substrate 102 is placed into the chamber 234, and the resistor layer 152 is formed over the insulating layer 150 by using a PVD process. In some embodiments, the substrate 102 is not heated during performing the deposition process, such as PVD process.

It should be noted that before performing the deposition process, no heating process is performed on the substrate 102. In other words, the substrate 102 is maintained at a constant value, for example, at room temperature. In some embodiments, the substrate 102 is maintained at a temperature of about 20 degrees to about 40 degrees.

Before the deposition process is performed on the substrate 102, if a heating process is performed on the substrate 102, the resistor layer 152 may have a greater grain size when compared with no heating process is performed on the substrate 102. In other words, the grain size of the resistor layer 152 is smaller because the substrate 102 is maintained at a constant temperature. Due to no external heating process before deposition of resistor layer 152, the stability of resistance and grain size of resistor layer 152 is improved.

If a heating process is performed on the substrate 102 before the substrate 102 transferred into the chamber 234, a resistor layer of a Comparative Example will be have a stronger intensity in (111) crystal orientation. In contrast to the Comparative Example, the resistor layer 152 of the disclosure has a relatively low crystalline structure. In other words, the major structure of the resistor layer 152 is amorphous.

FIG. 3 shows a box plot of the resistance data for a Comparative Example and an Example, in accordance with some embodiments of the disclosure. A Comparative Example is obtained by measuring the resistance value of the sample 1. Before the substrate of sample 1 is transported into the chamber 234, a heating process is performed on the substrate of the sample 1. Example is obtained by measuring the resistance value of the sample 2. Before the substrate of the sample 2 is transported into the chamber 234, no heating process is performed on the substrate 102 of the sample 2.

As show in FIG. 3, the uniformity of the resistance of the Example is better than that of the Comparative Example. Therefore, the uniformity of the resistance of the Example is improved, and the performance of the semiconductor device structure is also improved.

FIG. 4 shows a flow chart of a method for forming a semiconductor device structure, in accordance with some embodiments of the disclosure.

In operation 402, a substrate, such as substrate 102 is provided. In some embodiments, the substrate includes a gate structure over the substrate and an inter-layer dielectric (ILD) layer adjacent to the gate structure.

In operation 404, the substrate is transferred from a stage to a deposition chamber. It should be noted that no heating operation is performed on the stage. In some embodiments, the substrate 102 is transferred from the first stage 250 to the chamber 234.

In operation 406, a deposition process is performed over the ILD layer in the deposition chamber to form a resistor layer over the ILD layer. In some embodiments, PVD process is performed on the ILD layer 124 to form the resistor layer 152.

In some embodiments, the resistor layer 152 is formed by a physical vapor deposition (PVD) process.

In some embodiments, the PVD process is performed at a power in a range from about 500 W to about 10,000 W. If the power is lower than the 500 W, the deposition rate of the resistor layer 152 may be too low. If the power is higher than the 10,000 W, the deposition rate of the resistor layer 152 may be too fast. As a result, the uniformity of the thickness of the resistor layer 152 is difficult to control.

In some embodiments, the PVD process includes using nitrogen ($N_2$) gas, argon (Ar) gas, or combinations thereof. In some embodiments, the flow rate of nitrogen gas is in a range from about 20 sccm to about 150 sccm. In some embodiments, the flow rate of argon gas is in a range from about 20 sccm to about 80 sccm. If the flow rate of nitrogen gas and the flow rate of the argon gas are not within the above-mentioned range, the thickness may not meet the requirements.

It should be noted that the substrate 102 is maintained at room temperature before depositing the resistor layer 152. In addition, during PVD process, no heating process is performed on the substrate 102.

Embodiments for forming a semiconductor device structure and method for formation the same are provided. A semiconductor device structure includes a resistor layer formed over a substrate. The major structure of the resistor layer is amorphous. The substrate is maintained at room temperature before forming the resistor layer. In other words, the substrate is not heated before forming the resistor layer. Due to no external heating process before deposition of resistor layer, and therefore, the uniformity of the resistance of the resistor layer is improved, and the gate voltage (Vg) of the performance of the semiconductor device structure is also improved.

In some embodiments, a semiconductor device structure is provided. The semiconductor device structure includes a substrate, and the substrate includes a first region and a second region. The semiconductor device structure includes a gate structure formed over the first region of the substrate and an inter-layer dielectric (ILD) layer formed adjacent to the gate structure. The semiconductor device structure further includes a resistor layer is formed over the ILD layer over the second region of the substrate, and the major structure of the resistor layer is amorphous.

In some embodiments, a method for forming a semiconductor device structure is provided. The method includes providing a substrate, and the substrate includes an active region and a peripheral region. The method also includes forming a gate structure over the active region and forming an inter-layer dielectric (ILD) layer adjacent to the gate structure. The method further includes forming a resistor layer over the ILD layer over the peripheral region, and the major structure of the resistor layer is amorphous.

In some embodiments, a method for forming a semiconductor device structure is provided. The method includes providing a substrate, and the substrate includes a gate structure over the substrate and an inter-layer dielectric (ILD) layer adjacent to the gate structure. The method includes transferring the substrate from a stage to a deposition chamber, and no heating operation is performed on the stage. The method also includes performing a deposition process over the ILD layer in the deposition chamber to form a resistor layer over the ILD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a resistor layer over a dielectric layer over a semiconductor substrate, wherein a major structure of the resistor layer is amorphous, and wherein the forming the resistor layer includes:
        providing the semiconductor substrate having the dielectric layer on a stage;
        transferring the semiconductor substrate from the stage into a deposition chamber, wherein the transferred semiconductor substrate has a temperature below a temperature of the deposition chamber; and
        depositing the resistor layer in the deposition chamber, wherein the semiconductor substrate is not heated during the depositing.

2. The method for forming the semiconductor device structure as claimed in claim 1, wherein the semiconductor substrate is not heated in the deposition chamber before forming the resistor layer.

3. The method for forming the semiconductor device structure as claimed in claim 1, wherein the resistor layer is formed along (111), (200) and (220) crystal orientations.

4. The method for forming the semiconductor device structure as claimed in claim 3, wherein an intensity of the (200) crystal orientation is higher than an intensity of the (111) crystal orientation.

5. The method for forming the semiconductor device structure as claimed in claim 4, wherein an intensity of the (220) crystal orientation is substantially equal to the intensity of the (111) crystal orientation.

6. The method for forming the semiconductor device structure as claimed in claim 1, wherein the resistor layer includes titanium nitride (TiN), tantalum nitride (TaN), silicon chrome (SiCr), or aluminum nitride (AlN).

7. The method for forming the semiconductor device structure as claimed in claim 1, wherein the resistor layer is titanium nitride (TiN) having the major structure that is amorphous.

8. The method for forming the semiconductor device structure as claimed in claim 1, further comprising:
    forming a nitride layer over the resistor layer, wherein forming the nitride layer over the resistor layer comprises:
        performing a heating operation on the resistor layer; and
        after the heating operation, performing a plasma process on an exposed surface of the resistor layer to form the nitride layer.

9. The method for forming the semiconductor device structure as claimed in claim 1, wherein forming the resistor layer comprises performing a physical vapor deposition (PVD) process.

10. A method for forming a semiconductor device structure, comprising:
    providing a semiconductor substrate;
    transferring the semiconductor substrate from a stage to a deposition chamber such that a temperature of the semiconductor substrate provided to the deposition chamber is lower than that of the deposition chamber before a deposition process; and
    performing the deposition process of a physical vapor deposition (PVD) process or a chemical vapor deposition (CVD) process in the deposition chamber to form a resistor layer over the semiconductor substrate, wherein the deposition process forms the resistor layer having a major structure that is amorphous.

11. The method for forming the semiconductor device structure as claimed in claim 10, wherein the semiconductor substrate is maintained at a constant temperature from the stage to the deposition chamber before performing the deposition process.

12. The method for forming the semiconductor device structure as claimed in claim 10, wherein the transferring the semiconductor substrate from the stage to the deposition chamber includes transferring the substrate from a first stage to a second stage and subsequently from the second stage to the deposition chamber.

13. The method for forming the semiconductor device structure as claimed in claim 12, wherein the semiconductor substrate is not heated from the first stage to the deposition chamber.

14. The method for forming the semiconductor device structure as claimed in claim 12, wherein the semiconductor substrate is maintained at a temperature of about 20 degrees to about 40 degrees from the first stage to the deposition chamber.

15. A method for forming a semiconductor device structure, comprising:
    placing a semiconductor substrate on a stage;
    transporting the semiconductor substrate from the stage to a deposition chamber, wherein the semiconductor substrate is not heated while disposed on the stage and not heated during transporting from the stage to the deposition chamber;
    depositing a resistor layer over the semiconductor substrate in the deposition chamber;
    after depositing the resistor layer, heating the resistor layer; and
    performing a plasma process on the resistor layer after the heating, wherein the plasma process forms a nitride layer on a surface of the resistor layer.

16. The method of claim 15, wherein the transporting includes maintaining the semiconductor substrate at a temperature between about 20 degrees and about 40 degrees.

17. The method of claim 15, wherein the transporting includes providing the semiconductor substrate to the deposition chamber while the semiconductor substrate has a temperature lower than a temperature of the deposition chamber.

18. The method of claim 15, wherein the resistor layer is titanium nitride (TiN), tantalum nitride (TaN), silicon chrome (SiCr), or aluminum nitride (AlN), wherein the TiN, TaN, SiCr, or AlN have a major structure that is amorphous.

19. The method of claim 18, wherein the resistor layer is formed along (111), (200) and (220) crystal orientations.

20. The method of claim 15, wherein the semiconductor substrate is not heated during the depositing.

\* \* \* \* \*